United States Patent [19]

Shibata et al.

[11] 4,216,431
[45] Aug. 5, 1980

[54] INTEGRATED CIRCUIT FOR FREQUENCY CONVERSION

[75] Inventors: Akira Shibata, Katsuta; Yoshizumi Watatani, Yokohama, both of Japan

[73] Assignee: Hitachi, Ltd., Japan

[21] Appl. No.: 940,368

[22] Filed: Sep. 7, 1978

[30] Foreign Application Priority Data

Sep. 9, 1977 [JP] Japan .................................. 52-107795

[51] Int. Cl.² .............................................. H04B 1/26
[52] U.S. Cl. ................................... 455/333; 455/326; 455/343; 328/15; 307/271; 330/261
[58] Field of Search ............... 325/451, 450, 318, 430, 325/436, 442, 446; 328/15, 19, 20; 307/213, 260, 271, 288, 295, 313; 363/163, 159, 157, 10, 1; 330/307, 254, 261, 284; 332/43 R, 44, 31 T

[56] References Cited

U.S. PATENT DOCUMENTS

| | | | |
|---|---|---|---|
| 3,219,934 | 11/1965 | Kalfaian | 328/15 |
| 3,875,522 | 4/1975 | Hoefi | 330/254 |
| 4,058,771 | 11/1977 | Ohsawa et al. | 325/451 |

Primary Examiner—Robert L. Richardson
Assistant Examiner—Tommy P. Chin
Attorney, Agent, or Firm—Craig & Antonelli

[57] ABSTRACT

A frequency converter circuit suitable for being constructed in the form of an integrated circuit and adapted to the frequency conversion of a carrier chrominance signal for recording and reproducing chrominance video signals basically comprises a full balance type differential amplifier including three sets of paired differential transistors. Two sets of paired differential transistors, in which the collector of one transistor of one paired differential transistors is connected to that of the corresponding one transistor of the other paired differential transistors and the collector of the other transistor of the one paired differential transistors is connected to that of the other transistor of the other paired differential transistors, are provided for the output stage and have those collectors each connected to the respective emitters of grounded base transistors. The grounded base transistors have their collectors each connected to a load resistor. The output signal is picked up from the collector of one of the grounded base transistors.

5 Claims, 3 Drawing Figures

INTEGRATED CIRCUIT FOR FREQUENCY CONVERSION

This invention relates to a frequency converter circuit suitable for being constructed in the form of a semiconductor integrated circuit and more particularly to a frequency converter integrated circuit adapted to the frequency conversion of a carrier chrominance signal in a recording and reproducing apparatus for chrominance video signals.

Figure 1:
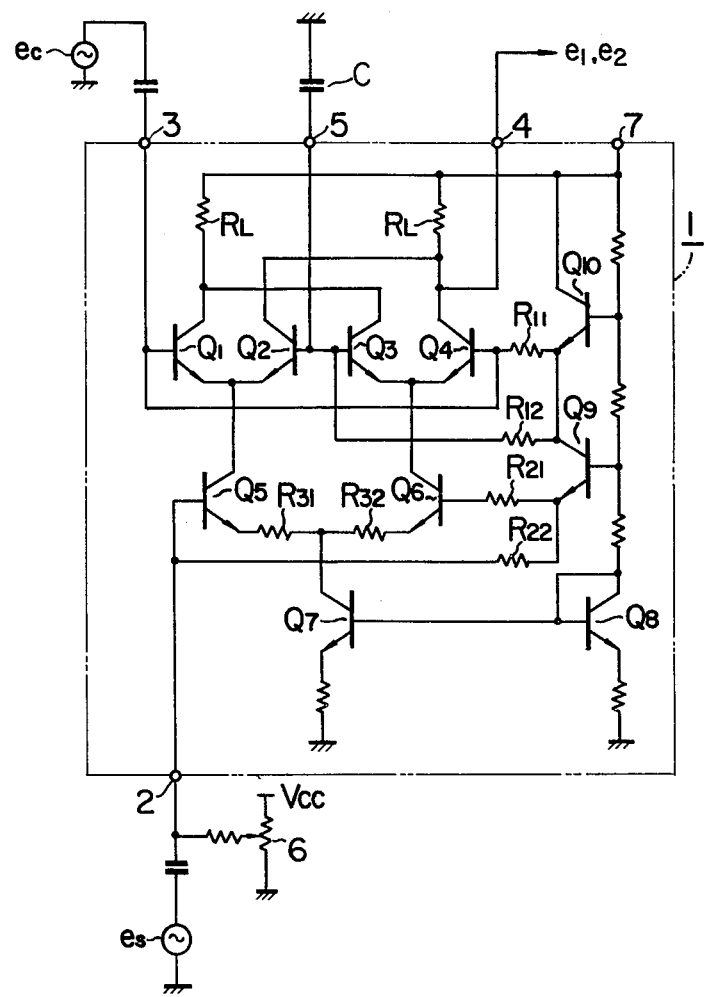
Figure 2:
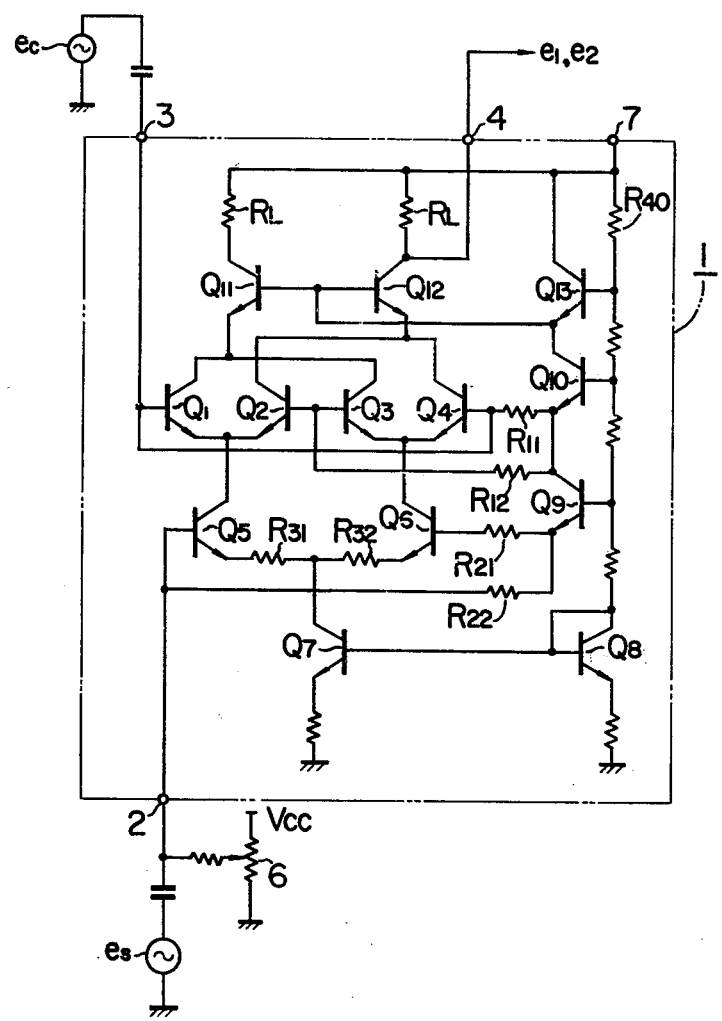
Figure 3:
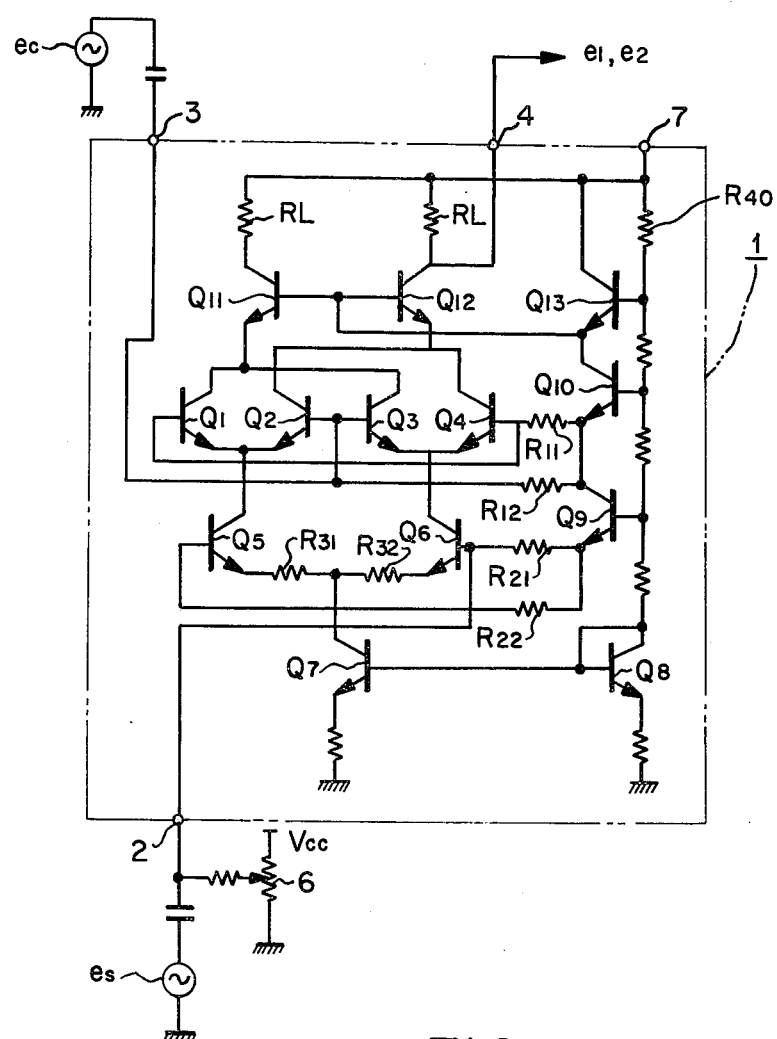

This invention as well as the prior art will be described referring to the accompanying drawings, in which:

FIG. 1 is a circuit diagram of an example of a prior art frequency converter circuit in the form of an integrated circuit; and FIGS. 2 and 3 are circuit diagrams of frequency converter circuits embodying this invention.

When recording a chrominance video signal with a video signal recording and reproducing apparatus such as a video tape recorder, it is general to frequency-modulate the brightness signal and to convert a carrier frequency of the carrier chrominance signal of about 3.58 MHz, for example, into a frequency of about 600 to 700 KHz. Thus, when reproducing, there needs the frequency conversion for returning the carrier of the converted low frequency band to the original carrier frequency.

An example of a prior art circuit, in the form of an integrated circuit, for effecting the frequency conversion is illustrated in FIG. 1. This frequency converter circuit is suitable for use in a reproducing circuit of a video tape recorder and adapted to return a chrominance signal of a converted low frequency band to a frequency of about 3.58 MHz in case of the NTSC system, for example. In FIG. 1, the frequency converter circuit in the form of a semiconductor integrated circuit is illustrated in a dotted line block and generally designated at reference numeral 1. An input terminal 2 is applied with the low frequency band chrominance signal contained in the signal read out from a magnetic tape. A signal source $e_s$ corresponds to the low frequency band chrominance signal. A terminal 3 is applied with a carrier $e_c$ necessary for the frequency conversion. The carrier $e_c$ is fed from a carrier generator circuit incorporated in the video tape recorder and corresponds to a signal source $e_c$. These two signals are processed at a multiplier circuit including a full balance type differential amplifier constituted by transistors $Q_1$ to $Q_7$ in such a manner that the low frequency band chrominance signal having a frequency of $f_s$ is switched by the carrier $e_c$ having a frequency of $f_c$, to produce a signal $e_1$ having a frequency of $(f_c - f_s)$ and a signal $e_2$ having a frequency of $(f_c + f_s)$ which are delivered out from an output terminal 4. Of these output signals, a necessary signal, for example, the signal $e_1$ of the frequency $(f_c - f_s)$ is selected through a band-pass filter (not shown). A terminal 7 is supplied with a power supply voltage. Transistors $Q_8$ to $Q_{10}$ constitute a bias circuit for biasing the transistors $Q_1$ to $Q_7$. Since the multiplier circuit constructed by the transistors $Q_1$ to $Q_7$ is the wellknown full balance type differential amplifier, as described above, it is apparent that the same multiplier operation is effected even if the low frequency band chrominance signal $e_s$ applied to the terminal 2 is supplied to not the base of the transistor $Q_5$ as shown in FIG. 1 but the base of the transistor $Q_6$. Similarly, it should be understood that the same multiplier operation is effected even if the carrier $e_c$ applied to the terminal 3 is supplied to not the bases of the transistors $Q_1$ and $Q_4$ as shown in FIG. 1 but the bases of the transistors $Q_2$ and $Q_3$. In that case, a terminal 5 connected to a capacitor C as will be hereinafter described is connected to the bases of the transistor $Q_1$ and $Q_4$ differently from the illustration.

This prior art circuit arrangement, however, poses a problem that the carrier $e_c$ leaks to the output terminal 4 provided for the signals $e_1$ and $e_2$ for various causes to be described later. In an example of a reproducing system of video tape recorder, $f_c = 4.2$ MHz and $f_s = 100$ to 1100 KHz are selected, prescribing that the necessary or desired signal $e_1$ is of a frequency of 3.1 to 4.1 MHz and the unwanted signal $e_c$ is of a frequency of 4.2 MHz. Accordingly, the frequencies of the desired and unwanted signals are very close to each other, encountering difficulties with elimination of the unwanted signal by means of only the filter connected subsequent to the output terminal 4. Accordingly, it is desirable to minimize the leakage of carrier as small as possible and practically, a ratio of $e_1/e_c$ is required to be more than 40 dB.

The leakage of carrier is first caused by the difference in DC collector current between the transistors $Q_5$ and $Q_6$. This difference arises from a slight difference between base-emitter voltages (hereinafter referred to as $V_{be}$) of the transistors $Q_5$ and $Q_6$ and a slight difference between resistances of emitter resistors $R_{31}$ and $R_{32}$, and accordingly can be eliminated by adjusting a variable resistor 6 such that the DC collector currents of the transistors $Q_5$ and $Q_6$ are equaled.

The leakage of carrier is secondly caused by unbalance of Miller effects due to base-collector junction capacities of the transistors $Q_1$, $Q_2$, $Q_3$ and $Q_4$. More particularly, base impedances of the transistors $Q_1$ and $Q_4$ are estimated to be a parallel resultant impedance of a signal source impedance of the carrier $e_c$ and a resistance of a bias resistor $R_{11}$ whereas base impedances of the transistors $Q_2$ and $Q_3$ are estimated to be a resistance of a bias resistor $R_{12}$ alone. Since the resistances of the resistors $R_{11}$ and $R_{12}$ are designed to be equal to each other in order to apply the same amount of bias, the base impedances of the transistors $Q_1$ and $Q_4$ become different from those of the transistors $Q_2$ and $Q_3$, resulting in difference in Miller effects. This leads to difference in voltage gains of the transistors $Q_2$ and $Q_4$ with the result that the AC signal voltage on the collector of the transistor $Q_2$ becomes different from that on the collector of the transistor $Q_4$. These AC signal voltages cannot be cancelled out, giving rise to the leakage of carrier.

To solve this problem, a terminal 5 is provided which is connected to the bases of the transistors $Q_2$ and $Q_3$ and grounded for AC signals through a capacitor C, and the impedance of the carrier signal source $e_c$ is decreased sufficiently so that Miller effects of the transistors $Q_1$, $Q_2$, $Q_3$ and $Q_4$ may be suppressed to a negligible degree. This measure, however, necessitates the AC grounding capacitor C of a large capacitance which is so bulky that cannot be built in the integrated circuit, requiring the provision of the external terminal 5. In design of a multi-functional integrated circuit, the increase in number of necessary, external terminals poses fatal restrictions and, in this sense, the necessity of the terminal adapted to suppress the carrier leakage unfavorably restricts the degree of freedom of design for the integrated circuit to a great extent.

An object of this invention is to provide a frequency converter circuit with a minimized number of external terminals suitable for being constructed in the form of an integrated circuit and capable of reducing the leakage of carrier.

To attain the above object, this invention provides a frequency converter circuit using a full balance type differential amplifier, characterized in that a load is connected through a grounded base transistor to the collector of a transistor connected to the output terminal. With this construction, the load impedance as viewed from the collectors of paired differential transistors on the output side is a low impedance and the signal voltage on the collector almost diappears, so that the carrier leakage can be prevented irrespective of a slight unbalance.

Referring to FIG. 2, there is shown a frequency converter circuit embodying this invention which comprises, like the circuit shown in FIG. 1, a full balance type differential amplifier suitable for being constructed in the form of an integrated circuit. Transistors $Q_1$ to $Q_7$ constitute the full balance type differential amplifier circuit for the frequency conversion, transistors $Q_8$ to $Q_{10}$ constitute a bias circuit, a terminal 3 is connected to receive a carrier $e_c$, and a terminal 2 is connected to receive a low frequency band chrominance signal.

Though in the embodiment shown in FIG. 2 the low frequency band chrominance signal applied to the terminal 2 is supplied to the base of the transistor $Q_5$ and the carrier applied to the terminal 3 is supplied to the bases of the transistors $Q_1$ and $Q_4$, it is apparent that multiplier operation for frequency conversion can be equally effected even if the low frequency band chrominance signal is supplied to the base of the transistor $Q_6$ and/or even if the carrier is supplied to the bases of the transistors $Q_2$ and $Q_4$, as is described in connection with FIG. 1. Such a circuit arrangement is shown in FIG. 3. The construction of FIG. 3 is the same as that of FIG. 2, except that the transistor(s) supplied with the signal(s) is interchanged to the symmetrically arranged counterpart(s). Different from the circuit of FIG. 1, the collectors of the transistors $Q_1$, $Q_3$ and the collectors of the transistors $Q_2$, $Q_4$ are not directly connected to load resistors but connected to the bases of common base transistors $Q_{11}$ and $Q_{12}$ respectively, load resistors $R_L$, $R_L$ are connected to the collectors of the additional transistors $Q_{11}$ and $Q_{12}$, and a transistor $Q_{13}$ and a resistor R 40 are added for feeding the bias to the transistors $Q_{11}$ and $Q_{12}$. The bases of the transistors $Q_{11}$ and $Q_{12}$ are connected in common to the emitter of the bias transistor $Q_{13}$ and assume a low impedance against an AC signal. This means that the collectors of the transistors $Q_1$ to $Q_4$ are loaded with a low impedance load. Accordingly, the AC signal voltage will not develop on the collectors of the transistors $Q_1$ to $Q_4$ and, as a result, the difference in voltage gain due to different Miller effects is not serious and the carrier leakage representative of the unwanted output signal can be reduced. The collector currents of the transistors $Q_2$ and $Q_4$ containing the necessary signal current are passed through the emitter of the transistor $Q_{12}$ to the collector thereof and then to the load resistor $R_L$, thereby delivering out the frequency converted signals $e_1$ and $e_2$ through the terminal 4. One of the two signals is selected through a bandpass filter (not shown) to produce the necessary signal.

In comparison with the circuit of FIG. 1, this embodiment shown in FIG. 2 dispenses with the terminal 5 and the AC grounding capacitor C and instead, adds to three transistors $Q_{11}$, $Q_{12}$ and $Q_{13}$ and the bias resistor $R_{40}$. However, the increase in number of such elements as transistor and resistor negligibly increases the chip size, not leading to any bulky integrated circuit, and it is obvious that the elimination of the external terminal has superiority.

Since it is not necessary, in FIG. 2, to pick up the signal from the collectors of the transistors $Q_1$ and $Q_3$, the provision of the transistor $Q_{11}$ is not always necessitated and the collectors of the transistors $Q_1$ and $Q_3$ connected in common may be connected directly to the power supply, without imparing the performance of the present circuit.

We claim:

1. A frequency converter circuit for receiving a carrier signal and a signal to be frequency-converted and delivering out the frequency-converted signal with a minimized leakage of the carrier, comprising:
   a first transistor of grounded emitter connection as a constant current source;
   second and third transistors with their emitters each connected to the collector of said first transistor through a resistor;
   fourth and fifth transistors with their emitters connected in common and connected to the collector of said second transistor;
   sixth and seventh transistors with their emitters connected in common and connected to the collector of said third transistor;
   means for connecting the collectors of said fourth and sixth transistors to each other;
   means for connecting the collectors of said fifth and seventh transistors to each other;
   means for connecting the bases of said fourth and seventh transistors to each other;
   means for connecting the bases of said fifth and sixth transistors to each other;
   an eighth transistor with its emitter connected to the collectors of said fifth and seventh transistors connected in common;
   a load connected to the collector of said eighth transistor;
   a first signal applying terminal connected to one of the bases of said second and third transistors;
   a second signal applying terminal connected either to the bases of said fourth and seventh transistors connected in common or to the bases of said fifth and sixth transistors connected to each other;
   means for applying said signal to be frequency-converted to one of said first and second signal applying terminals and said carrier signal to the other of the said and second signal applying terminals; and
   an output terminal connected to the collector of said eighth transistor.

2. A frequency converter circuit according to claim 1, further comprising means for connecting a power supply to the collectors of said fourth and sixth transistors connected to each other.

3. A frequency converter circuit according to claim 1, further comprising a ninth transistor with its emitter connected to the bases of said fourth and sixth transistors connected to each other, and a load connected to the collector of said ninth transistor.

4. A frequency converter circuit according to claim 1, 2 or 3, wherein the base of said eighth transistor is connected to bias means having a low impedance against an AC signal.

5. A frequency converter circuit according to claim 3, wherein the base of said ninth transistor is connected to the base of said eighth transistor to be connected to bias means having a low impedance against an AC signal.

* * * * *